United States Patent [19]
Bernstein et al.

[11] Patent Number: 5,731,703
[45] Date of Patent: Mar. 24, 1998

[54] MICROMECHANICAL D'ARSONVAL MAGNETOMETER

[75] Inventors: Jonathan J. Bernstein, Medfield; Marc S. Weinberg, Needham, both of Mass.

[73] Assignee: The Charles Stark Draper Laboratory, Inc., Cambridge, Mass.

[21] Appl. No.: 550,923

[22] Filed: Oct. 31, 1995

[51] Int. Cl.$^6$ .......................... G01R 33/02; G01R 33/00
[52] U.S. Cl. .......................... 324/256; 324/260
[58] Field of Search .......................... 324/244, 256, 324/259, 260, 261

[56] References Cited

U.S. PATENT DOCUMENTS

| | | | |
|---|---|---|---|
| 3,965,753 | 6/1976 | Browning, Jr. | 73/504 |
| 4,384,487 | 5/1983 | Browning | 73/382 G |
| 4,422,330 | 12/1983 | Fischell | 73/517 R |
| 4,510,802 | 4/1985 | Peters | 73/505 |
| 4,680,544 | 7/1987 | Rudolf | 324/259 |
| 4,804,915 | 2/1989 | Hoenig | 324/248 |
| 5,103,174 | 4/1992 | Wandass et al. | 324/244 |
| 5,241,861 | 9/1993 | Hulsing, II | 73/505 |
| 5,265,470 | 11/1993 | Kaiser et al. | 73/178 R |
| 5,290,102 | 3/1994 | Kaiser et al. | 324/244 |
| 5,293,781 | 3/1994 | Kaiser et al. | 73/862.625 |
| 5,315,247 | 5/1994 | Kaiser et al. | 324/244 |
| 5,319,976 | 6/1994 | Hulsing, II | 73/505 |
| 5,331,853 | 7/1994 | Hulsing, II | 73/505 |
| 5,331,854 | 7/1994 | Hulsing, II | 73/505 |
| 5,341,682 | 8/1994 | Hulsing, II | 73/505 |
| 5,412,988 | 5/1995 | Neff et al. | 73/517 R |
| 5,424,642 | 6/1995 | Ekwall | 324/256 |

FOREIGN PATENT DOCUMENTS

| 1279091 | 6/1972 | United Kingdom | 324/256 |
|---|---|---|---|

*Primary Examiner*—Walter E. Snow
*Attorney, Agent, or Firm*—Weingarten, Schurgin, Gagnebin & Hayes LLP

[57] ABSTRACT

A micromechanical D'Arsonval magnetometer for sensing magnetic fields at low frequency with high sensitivity for operation near the resonant frequency of a micromechanical structure comprising a movable proof mass supported by torsion flexures, a conductive winding formed on the movable proof mass, at least one bridge electrode spanning the movable proof mass, a source for electrically biasing the movable proof mass relative to the bridge electrode(s), and a drive for electrically driving the conductive winding. Magnetic fields in the plane of the proof mass perpendicular to an axis of rotation formed by the torsion flexures interact with current passing through the conductive winding so as to torque the proof mass about the axis of rotation, whereby the resulting rotation is sensed through capacitors formed between the proof mass and the bridge electrode(s). The present invention micromechanical D'Arsonval magnetometer can be operated either open or closed loop. An open loop embodiment allows the proof mass to twist solely under the influence of the magnetic fields, while a closed loop embodiment restrains the proof mass motion. The loop can be closed by constructing additional electrodes or by using the existing bridge electrode(s) for both sensing and rebalancing.

32 Claims, 3 Drawing Sheets

MICROMECHANICAL D'ARSONVAL MAGNETOMETER

FIELD OF INVENTION

The present invention relates generally to magnetometers and, more particularly, to a micromechanical D'Arsonval magnetometer for sensing low frequency magnetic fields with high sensitivity.

BACKGROUND OF THE INVENTION

Several methods have been employed over the years to measure magnetic fields. Such magnetometers have a wide range of usage. However, most of these methods have inherent disadvantages. For instance, Hall effect sensors have long been used for proximity sensing in typewriter keyboards. Inexpensive Hall effect devices typically employ silicon semiconductors. However, these devices have not been satisfactory as sensitive magnetic field sensors because of large zero input offset voltages and thermal sensitivity (mainly due to electron mobility). In contrast, flux gate sensors are widely used as magnetometers due to their sensitivity. These sensitive units are typically cube shaped having sides which are greater than 1 cm in length (much larger than the size of a typical micromechanical structure). With their required flux concentrating magnetic core, the sensitivities achieved with such sensors are an order greater than most other sensors lacking magnetic cores. However, weak points are present which include thermal sensitivity of the magnetic cores, high drive power, and complexity of discrete windings (see E. Ramsden, "Measuring Magnetic Fields with Flux Gate Sensors", Sensors, Vol. 11, No. 9, September, 1994; and P. Vizmuller, "The Flux-Gate Magnetometer: A Very Sensitive ELF Magnetic Detector", RF Design, January, 1994, pp. 24–30). Micromachined flux gates have been constructed, but exhibit poor sensitivity and suffer from spurious frequency content (see S. Kawahito et al., "A Fluxgate Magnetic Sensor with Micro-Solenoids and Electroplated Permalloy Cores", Sensors and Actuators, Number 43, 1994, pp. 128–134).

Magnetostrictive materials have been used in magnetometers as exemplified by one manufactured by Honeywell having a magnetometer that employs a magnetostrictive material (i.e. a thin film of ferromagnetic material). The quoted performance is $\pm 2 \times 10^{-4}$ T with 1% accuracy and resolution of $5 \times 10^{-8}$ T (see "Product Notes", Sensors, November, 1994, p. 61). This performance is limited by the magnetostrictive material (thermal sensitivity) and is not sensitive to direction. It is also less than expected for the present invention micromechanical D'Arsonval magnetometer.

Giant magnetoresistance ratio (GMR) materials have also been used in magnetometers. For example, a sandwich structure of magnetic and nonmagnetic thin films is presently being developed by Nonvolative Electronics, Inc. GMR promises an order of magnitude greater resistance variation than ordinary magnetostrictive materials. However, disadvantages similar to those of magnetostrictive materials are present with their use.

Electrically conductive search coils can be used in magnetometers. Changing magnetic fluxes induce voltages in such coils. With fixed or non-moving coils only altering fields can be sensed. DC sensing requires mechanically moving the coil. As a magnetometer, sensitivity is poor when the coils are small. Thus, search coils are not compatible with micromachining.

An optically pumped magnetometer has also been developed based on the 1896 discovery of Dutch physicist Peter Zeeman which demonstrated that some of the characteristic spectral lines are split when atoms are placed into a magnetic field. However, because they use Cesium vapors and RF sources, these Zeeman-effect magnetometers are large, expensive, and consume several Watts of power.

Superconducting quantum interference devices (SQUID's) are used to measure magnetic fields and are very sensitive. However, the required superconducting temperatures limit their usage.

Magnetodiodes and magnetotransistors may be employed to measure magnetic fields. Such devices utilize the sensitivity of PN junctions to magnetic fields. These devices are more sensitive than Hall effect devices, but they have not been commercially accepted.

Fiber optic and magneto-optic sensors (Faraday rotator) for measuring magnetic fields are currently under development. These units promise great sensitivity, but with the complexity of optical sources, detectors, and signal processing. Also, due to limitations in bending light in wave guides, micromechanical size units are not expected.

As evidenced by the foregoing, inherent disadvantages exist in all of the above-described methods, particularly with respect to properties of materials used therein. Accordingly, it would be desirable to provide a method, and an associated means, for measuring magnetic fields which does not rely upon semiconductor mobility effects or magnetic material properties, which are temperature sensitive.

SUMMARY OF THE INVENTION

The present invention contemplates a method, and an associated means, for measuring magnetic fields which does not rely upon semiconductor mobility effects or magnetic material properties, which are temperature sensitive. In particular, the present invention is directed toward a micromechanical D'Arsonval magnetometer for sensing low frequency magnetic fields with high sensitivity.

The present invention micromechanical D'Arsonval magnetometer comprises a movable proof mass supported by torsion flexures, a conductive winding formed on the movable proof mass, at least one bridge electrode spanning the movable proof mass, means for electrically biasing the movable proof mass relative to the bridge electrode(s), and means for electrically exciting the conductive winding. Magnetic fields in the plane of the proof mass perpendicular to an axis of rotation formed by the torsion flexures interact with current passing through the conductive winding so as to torque the proof mass about the axis of rotation, whereby the resulting rotation is sensed through capacitors formed between the proof mass and the bridge electrode(s).

The present invention micromechanical D'Arsonval magnetometer can be operated either open or closed loop. An open loop embodiment allows the proof mass to twist solely under the influence of the magnetic fields, while a closed loop embodiment restrains the proof mass motion. The loop can be closed by constructing additional electrodes or by using the existing bridge electrode(s) for both sensing and rebalancing.

The present invention micromechanical D'Arsonval sensor offers a unique combination of performance versus size where a very small, inexpensive device gives resolution comparable to the most sensitive, but larger and more costly prior art magnetometers. The sensor does not rely on the stability of magnetic materials or electrical properties of semiconductors so that stability over time and temperature is improved.

From the above descriptive summary it is apparent how the present invention means and method overcome the shortcomings of the above-mentioned prior art.

3

Accordingly, the primary object of the present invention is to provide a micromechanical D'Arsonval magnetometer for sensing low frequency magnetic fields with high sensitivity.

The above primary object, as well as other objects, features, and advantages, of the present invention will become readily apparent from the following detailed description which is to be read in conjunction with the appended drawings.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF A PREFERRED EMBODIMENT

Figure 1:
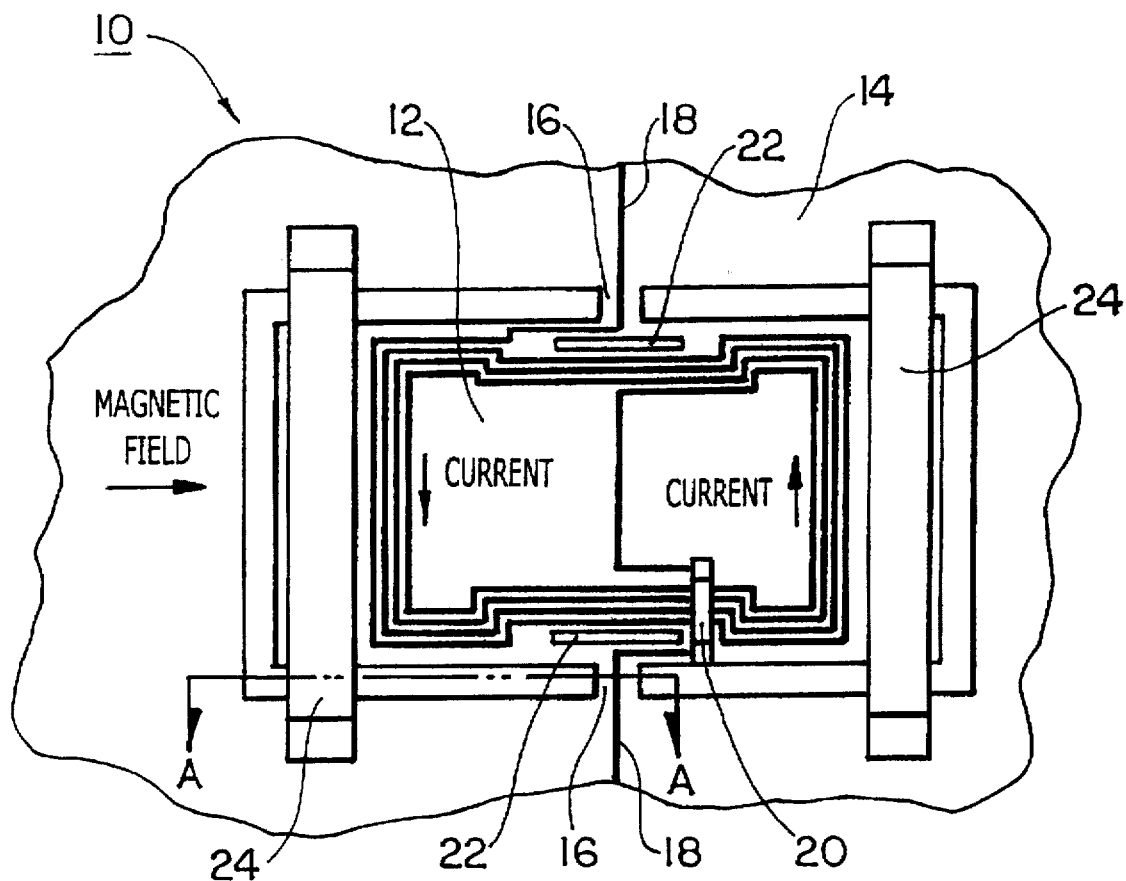
FIG. 1 is a plan view of a first embodiment of a micromechanical D'Arsonval magnetometer according to the present invention.

Referring to FIG. 1, there is shown a plan view of a micromechanical D'Arsonval magnetometer 10 according to the present invention. The micromechanical D'Arsonval magnetometer 10 comprises a movable proof mass 12 that is etched out from a silicon substrate 14. The proof mass 12 is movable about an axis of rotation provided by a pair of torsion flexures 16 formed between the proof mass 12 and the substrate 14.

Figure 2:
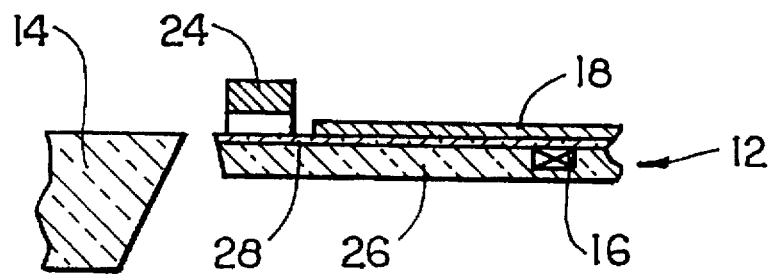
FIG. 2 is a cross-sectional side view of the micromechanical D'Arsonval magnetometer shown in FIG. 1, taken along line A—A of FIG. 1.

A conductive winding 18 is formed on, but electrically isolated from, the proof mass 12 (see FIG. 2). The conductive winding 18 enters and exits the area of the proof mass 12 by way of the pair of torsion flexures 16. A cross-over connection 20 is also formed on the proof mass 12 so as to allow the conductive winding 18 to maintain a spiral path throughout.

At this point it should be noted that a pair of stress relief apertures 22 are formed in the proof mass 12 so as to relieve some of the stress inflicted on the pair of torsion flexures 16 resulting from any rotational movement of the proof mass 12.

A pair of bridge electrodes 24 are formed on the substrate 14 so as to span over the proof mass 12 (see FIG. 2). The pair of bridge electrodes 24 are symmetrically spaced and located over opposite ends of the proof mass 12, equidistant from the pair of torsion flexures 16.

Referring to FIG. 2, there is shown a cross-sectional side view of the micromechanical D'Arsonval magnetometer 10 shown in FIG. 1. The proof mass 12 is shown comprising three layers, of which the conductive winding 18 is one. The other layers comprise a substrate layer 26, which is typically crystalline silicon, and an insulating layer 28, which is typically silicon oxide. The conductive winding 18 is typically gold. It should be noted that materials are selected so as to eliminate or limit curling of the proof mass 12, as will be described in detail below.

The substrate 14, from which the proof mass 12 is formed, is typically crystalline silicon. The magnetometer 10 is typically etched from the crystalline silicon by a technique known as bulk silicon micromachining, which includes boron etch stops and anisotropic etching. The bridge electrodes 24, similar to the conductive winding 18, are typically gold. However, the bridge electrodes 24 can also be fabricated from nickel, polysilicon, or from other materials. The bridge electrodes 24 are typically electroplated.

The concept of D'Arsonval movement is well-known in conventional current and voltage meters, but it is not used in macro-sized magnetometers because inaccuracies in measuring force and/or displacement prevent high sensitivity. Also, the low resonant frequencies of larger devices result in low bandwidth. Because of limitations of conventional devices, the concept of D'Arsonval movement is typically not even mentioned with magnetometers in survey articles (see J. E. Lenz, "A Review of Magnetic Sensors", Proceedings of the IEEE, Vol. 78, No. 6, June 1990, pp. 973–989). The concept is feasible for micro-sized structures, however, because of the excellent resolution results that are obtainable due to small displacement capacitors, which are easily constructed in micromechanical devices, and due to the small size of the magnetometer, which utilizes the advantageous scaling laws between magnetic force and stiffness. A typical size of the proof mass 12 in a micromechanical magnetometer 10 according to the present invention is 1 mm² or less.

In operation, the resonant frequency of the magnetometer 10 is determined by the proof mass 12 and the pair of torsion flexures 16. The conductive winding 18 is excited with alternating current at a frequency near this resonant frequency. Constant magnetic fields in the plane of the substrate 14 perpendicular to the axis of rotation of the torsion flexures 16 (see FIG. 1) interact with the current passing through the conductive winding 18 so as to torque the proof mass 12 about the axis of rotation according to the following equation, $$\vec{F} = I\vec{l} \times \vec{B} \tag{1}$$

wherein $\vec{F}$ is the resultant force on the proof mass 12, I is the current in the conductive winding 18, $\vec{l}$ is the length of the conductive winding 18, and $\vec{B}$ is the flux density of the magnetic field. The resulting rotation is sensed through the capacitors formed between the proof mass 12 and the bridge electrodes 24. The proof mass 12 is typically biased in the range of 5 to 10 VDC.

For a constant magnetic field, the output motion of the proof mass 12 is sinusoidal at the drive frequency. When driven open loop, the amplitude of the rotation is proportional to the low frequency magnetic field. This motion can be detected by several techniques. To avoid pick-up of the drive current in the output signal, the proof mass 12 is biased at a constant potential so that the differential current from the bridge electrodes 24 indicates rotational movement directly.

The AC drive reduces errors from slowly varying causes, such as tilting of the proof mass 12 caused by temperature variations. With no external magnetic field, if the proof mass 12 deforms under slowly varying thermal inputs, the motion is not in the sense band near the drive frequency. Hence, the instrument bias is unaffected. Slow deformations affect only the scale factor, which generally is allowed more latitude than the bias.

Driving the conductive winding 18 near the resonant frequency multiplies the sensitivity, but also increases the open loop scale factor (SF) sensitivity to variations in the resonant frequency. A driving current at a frequency 5% below the resonant frequency is therefore recommended. With closed loop operation, however, closer spacing of the drive frequency and the resonant frequency is possible so that greater sensitivity can be achieved. With simple DC biasing on the proof mass 12, the sensed position signal is typically at 5 kHz or more so that low frequency preamplifier drift is avoided.

Figure 5:
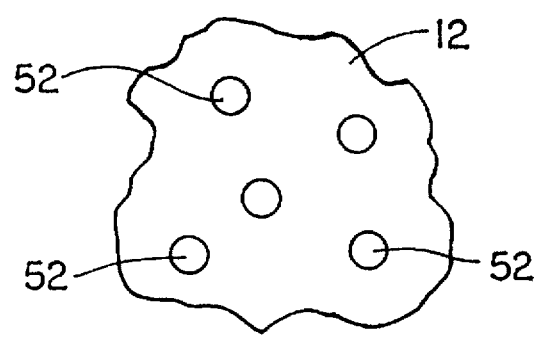
FIG. 5 is a plan view of a section of the proof mass in the micromechanical D'Arsonval magnetometer shown in FIG. 1.
Figure 6:
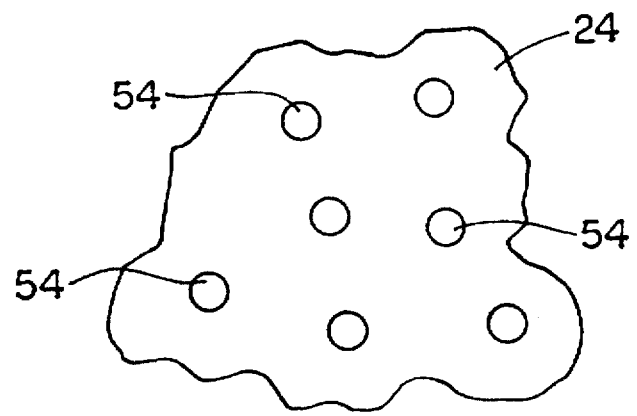
FIG. 6 is a plan view of a section of a bridge electrode in the micromechanical D'Arsonval magnetometer shown in FIG. 1.

For maximum resolution, Brownian motion effects, which depend upon damping, can be made small by evacuating the package and constructing holes into either the proof mass 12 or the bridge electrodes 24. Referring briefly to FIG. 5, such holes 52 are shown formed in the proof mass 12. Referring briefly to FIG. 6, such holes 54 are shown formed in a bridge electrode 24.

As previously mentioned, the materials are selected so that the proof mass 12 does not curl with variations in temperature. The material thicknesses are also selected with this in mind. One set of possible thicknesses is 0.4 µm gold, 1 µm oxide, and 10 µm silicon. A second possible set of thicknesses is 0.1 µm gold, 0.25 µm oxide, and 5 µm silicon. The exact thicknesses may vary with conductor geometry. Of course, other material combinations and/or layer thicknesses may be used.

Besides thermally induced curling, gradients in material dopants must also be controlled so that the proof mass 12 does not curl.

Design studies which include mass and wire dimensions, ohmic power, and self heating, indicate that resolution of about $10^{-9}$ T/√Hz is feasible. These projections assume a present commercial amplifier such as the AD549 and that no flux concentration is used.

Many variations to the basic design are evident to those versed in micromechanical or magnetometer design. For instance, the motion of the proof mass 12 can be detected by several other techniques. Voltage can be applied to the bridge electrodes 24 so that current flowing through the torsion flexures 16 will indicate rotation of the proof mass 12. Alternating voltages (modulation), rather than DC voltages, can be applied to excite the proof mass 12. Piezoelectric materials such as PZT can be used to sense the AC rotation. Also, the torsion flexures 16 can be doped so that a piezoresistive read-out can be realized, as is done in some pressure sensors.

As previously indicated, either open or closed loop operations are feasible. The loop can be closed by constructing additional electrodes or by using the existing bridge electrodes 24 for two functions (i.e. sensing and rebalancing). Additional electrodes can be additional bridges or can be buried below the proof mass 12.

Figure 3:
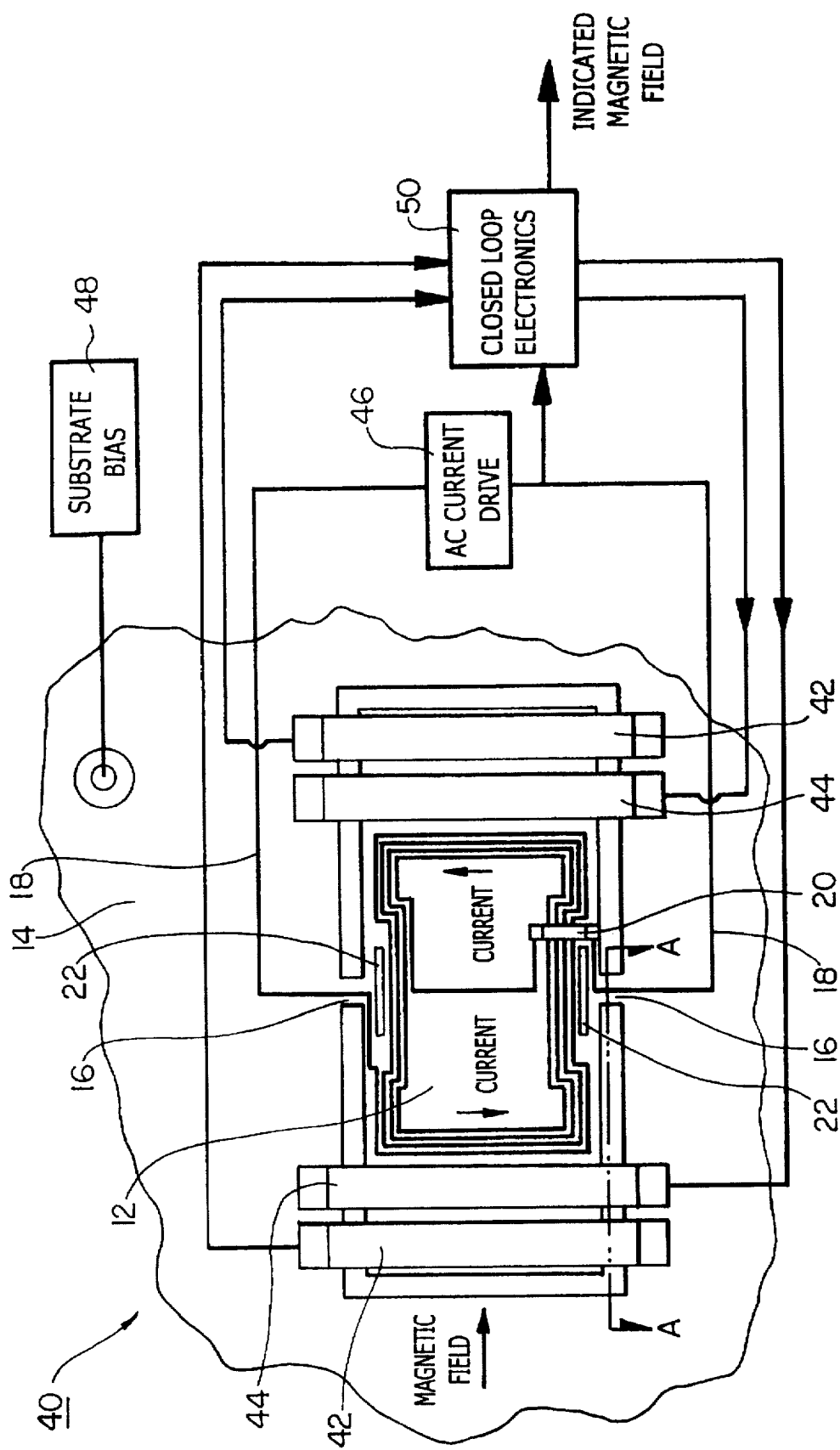
FIG. 3 is a plan view of a second embodiment of a micromechanical D'Arsonval magnetometer according to the present invention.

Referring to FIG. 3, there is shown a plan view of a micromechanical D'Arsonval magnetometer 40 according to the present invention having two sets of bridge electrodes 42 and 44 for closed loop operation. The first set 42 of electrodes is for sensing and the second set 44 of electrodes is for rebalancing. Similar to the magnetometer 10 described above, the conductive winding 18 is excited with alternating current from a current drive source 46 at a frequency near the resonant frequency of the proof mass 12. Also, the substrate 14, and hence the proof mass 12, is biased by a voltage bias source 48. Magnetic fields in the plane of the substrate 14 perpendicular to the axis of rotation formed by the torsion flexures 16 (see FIG. 4) interact with the current passing through the conductive winding 18 so as to torque the proof mass 12 about the axis of rotation. The resulting rotation of the proof mass 12 is sensed through the capacitors formed between the proof mass 12 and the sensing electrodes 42 whereby corresponding position signals are sent to closed loop electronics 50. The closed loop electronics 50 process these position signals, along with the AC drive signal from the current drive source 46, and provide rebalance voltage signals to the rebalance electrodes 44 so as to maintain the proof mass 12 in a relatively balanced position with respect to the sensing electrodes 42 through electrostatic force. The closed loop electronics 50 also provide an output signal indicative of the applied magnetic fields.

Figure 4:
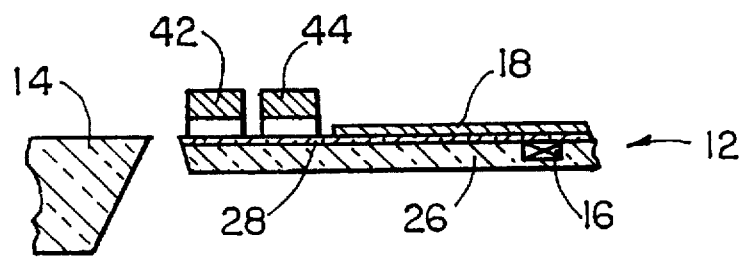
FIG. 4 is a cross-sectional side view of the micromechanical D'Arsonval magnetometer shown in FIG. 3, taken along line A—A of FIG. 3.

As shown in FIG. 4, both the sensing and the rebalance electrodes 42 and 44 are bridge electrodes that span the proof mass 12. However, as previously indicated, these electrodes 42 and 44 can be any combination of bridge and/or buried electrodes.

The present invention allows for other types of variations, particularly with respect to the types of fabrication techniques that can be used. For instance, other micromachining techniques such as the following are feasible: (1) layers of polysilicon (surface micromachining); (2) ceramic ferroelectric (for example, PZT) position read-out; (3) quartz substrate with deposited coils and quartz piezoelectric rotation sensing; and (4) sandwiches of silicon and glass or silicon bonding (these sandwiches would result in symmetric structures that would not be susceptible to curling).

Additionally, flux concentration can be achieved by using ferromagnetic material to concentrate the flux impinging upon the sensor, as is the case with many other types of magnetometers.

Commercial applications of the present invention are emerging in navigation and medical products. Many micromechanical inertial instruments are targeted toward navigation where the magnetometer offers an alternative in accurate detection of azimuth. To wrist watches now containing micromechanical pressure sensors used as altimeters, barometers, and solid state thermometers, a magnetic compass is a natural addition. The present invention sensor can be applied to surveillance where detection of distortions in magnetic fields is a natural companion. Also, interest has been shown in applying small, inexpensive magnetometers to laproscopes and other surgical instruments so as to precisely locate instruments during surgery in humans.

The present invention is not to be limited in scope by the specific embodiment described herein. Indeed, various modifications to the present invention, in addition to those described herein, will be apparent to those of skill in the art from the foregoing description and accompanying drawings. Thus, such modifications are intended to fall within the scope of the appended claims. Additionally, various references are cited throughout the specification, the disclosures of which are each incorporated herein by reference in their entirety.

What is claimed is:

1. A sensor for sensing low frequency magnetic fields with high sensitivity, said sensor comprising:

a proof mass, said proof mass being movable about an axis of rotation;

a conductive winding, said conductive winding being formed on said proof mass while being electrically isolated therefrom;

at least one bridge electrode, said at least one bridge electrode being disposed proximate said proof mass;

means for electrically biasing said proof mass relative to said at least one bridge electrode; and means for electrically exciting said conductive winding.

2. The sensor as defined in claim 1, further comprising a substrate, wherein said proof mass is etched from said substrate, and wherein said axis of rotation is provided by at least two torsion flexures which remain between said proof mass and said substrate after said etching.

3. The sensor as defined in claim 2, wherein said substrate is silicon.

4. The sensor as defined in claim 1, wherein said proof mass has at least one stress relief aperture formed therein.

5. The sensor as defined in claim 1, wherein said proof mass is silicon.

6. The sensor as defined in claim 1, wherein said conductive winding is electrically isolated from said proof mass by an insulating layer formed therebetween.

7. The sensor as defined in claim 6, wherein said insulating layer is silicon oxide.

8. The sensor as defined in claim 1, wherein said conductive winding is gold.

9. The sensor as defined in claim 1, wherein said at least one bridge electrode comprises two bridge electrodes symmetrically spaced and located over opposite ends of said proof mass, equidistant from said axis of rotation.

10. The sensor as defined in claim 1, wherein said at least one bridge electrode is gold.

11. The sensor as defined in claim 1, wherein said at least one bridge electrode is electroplated.

12. The sensor as defined in claim 1, wherein said means for electrically biasing said proof mass comprises means for applying a DC bias signal thereto.

13. The sensor as defined in claim 1, wherein said means for electrically exciting said conductive winding comprises means for applying an AC drive signal thereto.

14. The sensor as defined in claim 13, wherein said proof mass has a resonant frequency, and wherein said AC drive signal is oscillating near said resonant frequency.

15. The sensor as defined in claim 14, wherein said AC drive signal is oscillating at 5% below said resonant frequency during open loop operation.

16. A sensor for sensing low frequency magnetic fields with high sensitivity, said sensor comprising:

a substrate;

a proof mass, said proof mass being movable about an axis of rotation provided by at least two torsion flexures formed between said proof mass and said substrate;

a conductive winding, said conductive winding being formed on said proof mass while being electrically isolated therefrom;

at least one bridge electrode, said at least one bridge electrode being disposed proximate said proof mass;

means for electrically biasing said proof mass relative to said at least one bridge electrode; and means for electrically exciting said conductive winding.

17. The sensor as defined in claim 16, wherein said proof mass has a resonant frequency, and wherein said means for electrically exciting said conductive winding comprises means for applying an AC drive signal oscillating near said resonant frequency thereto.

18. The sensor as defined in claim 17, wherein said AC drive signal is oscillating at 5% below said resonant frequency during open loop operation.

19. The sensor as defined in claim 16, wherein said at least one bridge electrode comprises two bridge electrodes symmetrically spaced and located over opposite ends of said proof mass, equidistant from said axis of rotation.

20. A sensor for sensing low frequency magnetic fields with high sensitivity, said sensor comprising:

a proof mass, said proof mass being movable about an axis of rotation;

a conductive winding, said conductive winding being formed on said proof mass while being electrically isolated therefrom;

at least one bridge electrode, said at least one bridge electrode being disposed proximate said proof mass;

means for electrically biasing said proof mass relative to said at least one bridge electrode;

means for electrically exciting said conductive winding; and means for sensing the distance between said at least one bridge electrode and said proof mass.

21. The sensor as defined in claim 20, further comprising:

at least one rebalance electrode, said at least one rebalance electrode being disposed proximate said proof mass; and means for electrically driving said at least one rebalance electrode so as to maintain said proof mass in a relatively balanced position with respect to said at least one bridge electrode.

22. The sensor as defined in claim 21, wherein said means for electrically driving said at least one rebalance electrode provides an output signal indicative of a magnetic field applied to said sensor.

23. The sensor as defined in claim 21, wherein electrostatic force is used to maintain said proof mass in a relatively balanced position with respect to said at least one bridge electrode.

24. The sensor as defined in claim 21, wherein said means for electrically driving said at least one rebalance electrode utilizes said means for sensing the distance between said at least one bridge electrode and said proof mass so as to provide a closed loop feedback system.

25. The sensor as defined in claim 20, wherein said means for sensing the distance between said at least one bridge electrode and said proof mass provides an output signal indicative of a magnetic field applied to said sensor.

26. The sensor as defined in claim 20, wherein said means for sensing the distance between said at least one bridge electrode and said proof mass comprises means for electrically driving said at least one bridge electrode so as to maintain said proof mass in a relatively balanced position with respect to said at least one bridge electrode.

27. The sensor as defined in claim 1, wherein said proof mass and said at least one bridge electrode have holes formed therein for reducing Brownian motion effects.

28. The sensor as defined in claim 16, wherein said proof mass and said at least one bridge electrode have holes formed therein for reducing Brownian motion effects.

29. The sensor as defined in claim 20, wherein said proof mass and said at least one bridge electrode have holes formed therein for reducing Brownian motion effects.

30. The sensor as defined in claim 1, wherein said sensor is less than 1 $mm^2$ in size.

31. The sensor as defined in claim 16, wherein said sensor is less than 1 $mm^2$ in size.

32. The sensor as defined in claim 20, wherein said sensor is less than 1 $mm^2$ in size.

* * * * *